(12) United States Patent
Ma et al.

(10) Patent No.: US 7,579,921 B2
(45) Date of Patent: Aug. 25, 2009

(54) ON-OFF KEYING-7-PHASE SHIFT KEYING MODULATION SYSTEM AND METHOD FOR FIBER COMMUNICATION

(75) Inventors: Chuanhui Ma, Princeton, NJ (US); Ting Wang, Princeton, NJ (US)

(73) Assignee: NEC Laboratories America, Inc., Princeton, NJ (US)

( * ) Notice: Subject to any disclaimer, the term of this patent is extended or adjusted under 35 U.S.C. 154(b) by 54 days.

(21) Appl. No.: 12/048,451

(22) Filed: Mar. 14, 2008

(65) Prior Publication Data

US 2008/0266014 A1    Oct. 30, 2008

Related U.S. Application Data

(60) Provisional application No. 60/913,859, filed on Apr. 25, 2007.

(51) Int. Cl.
*H04L 27/20* (2006.01)
*H04L 27/22* (2006.01)

(52) U.S. Cl. ............................ 332/103; 329/304
(58) Field of Classification Search ......... 332/103–105; 329/304–310; 375/279–284, 308, 329–333, 375/346
See application file for complete search history.

(56) References Cited

U.S. PATENT DOCUMENTS 5,535,244 A * 7/1996 Nakatsu et al. ............. 375/261

FOREIGN PATENT DOCUMENTS

| DE | 19843243373 A | 7/1984 |
| JP | 2004208254 A | 7/2004 |
| KR | 20030072724 A | 9/2003 |
| KR | 20060071084 A | 6/2006 |

* cited by examiner

*Primary Examiner*—David Mis
(74) *Attorney, Agent, or Firm*—James Bitetto

(57) ABSTRACT

A modulation system includes a modulator configured to employ a modulation mechanism on data. The mechanism includes a signal constellation configured to map sub-carriers which include a signal to be modulated. The signal constellation has a plurality of points asymmetrically disposed on a circle about an origin and a point at the origin wherein a number of sub-carriers becomes variable over different symbol intervals. Corresponding demodulators and corresponding methods are also disclosed.

21 Claims, 4 Drawing Sheets

ON-OFF KEYING-7-PHASE SHIFT KEYING MODULATION SYSTEM AND METHOD FOR FIBER COMMUNICATION

RELATED APPLICATION INFORMATION

This application claims priority to provisional application Ser. No. 60/913,859 filed on Apr. 25, 2007, incorporated herein by reference.

BACKGROUND

1. Technical Field

The present invention relates to signal modulation and more particularly to a modulation system and method that improve power efficiency and reduces inter-carrier interference (ICI).

2. Description of the Related Art

Orthogonal Frequency Division Multiplexing (OFDM) has achieved great success in wireless and cable communications due to its robustness against multipath fading and its potential for high spectral efficiency. However, OFDM is sensitive to frequency distortion. For optical fiber communication, chromatic dispersion (CD) and polarization mode dispersion (PMD) have similar frequency distortion effects. To compensate for these dispersions, and to take advantage of the high spectral efficiency, the OFDM applications in optical systems have begun to be investigated.

Directly applying OFDM into optical systems has at least the following problems: (a) sensitivity to carrier frequency offset (CFO) caused by the misalignment in carrier frequencies between transmitter and receiver; (b) sensitivity to the receiver In-phase and Quadrature (IQ) imbalance due to manufacturing inaccuracies. Both CFO and IQ imbalance will cause Inter-Carrier Interference (ICI) among the sub-carriers and decrease the Carrier-to-Interference Ratio (CIR), thus degrading system performance.

Referring to FIG. 1, a signal constellation for 8-PSK (8-phase shift keying) is illustratively shown. OFDM systems using conventional 8-PSK, whose signal constellation is shown in FIG. 1, use all sub-carriers simultaneously to transmit modulated symbols. The number of sub-carriers and the separation between the sub-carriers are fixed all the time. When the CFO and the IQ imbalances exist, all sub-carriers will contribute to the ICI, which will degrade system performance. Due to the fact that all sub-carriers are used all the time, there is no power efficiency improvement.

An OFDM system using 8-PSK modulation uses modulated signal waveforms for 8-PSK which can be expressed as $$s_m(t) = g(t)\cos\left[2\pi f_c t + \frac{2\pi}{8}(m-1)\right] \quad 1 \le m \le 8, 0 \le t \le T \quad (1)$$

where g(t) is the pulse shape, t is time, T is the period or symbol duration, $f_c$ is the carrier frequency.

SUMMARY

A modulation system includes a modulator configured to employ a modulation mechanism on data. The mechanism includes a signal constellation configured to map sub-carriers which include a signal to be modulated. The signal constellation has a plurality of points asymmetrically disposed on a circle about an origin and a point at the origin wherein a number of sub-carriers become variable over different symbol intervals. Corresponding demodulators and corresponding methods are also disclosed.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

The present embodiments present an orthogonal frequency division multiplexing (OFDM) optical system using On-Off-Keying 7-Phase-Shift-Keying (OOK-7PSK) modulation that provides improved power efficiency and reduced inter-carrier interference (ICI). The OFDM system using On-Off-Keying 7-Phase-Shift-Keying (OOK-7PSK) modulation, which includes seven evenly spaced points on a circle plus a point at the origin, reduces the ICI in high-data-rate fiber communication systems. The numerical and simulation results show that the OFDM system using OOK-7PSK is more robust against both CFO and IQ imbalance compared to the OFDM system using conventional 8-PSK modulation. The OOK-7PSK modulation reduces Inter-Carrier interference and improves the power efficiency. These benefits are achieved without additional system complexity.

Embodiments described herein may be entirely hardware, entirely software or including both hardware and software elements. In a preferred embodiment, the present invention is implemented in hardware with possible software elements. Software includes but is not limited to firmware, resident software, microcode, etc.

Embodiments may include a computer program product accessible from a computer-usable or computer-readable medium providing program code for use by or in connection with a computer or any instruction execution system. A computer-usable or computer readable medium may include any apparatus that stores, communicates, propagates, or transports the program for use by or in connection with the instruction execution system, apparatus, or device. The medium can be magnetic, optical, electronic, electromagnetic, infrared, or semiconductor system (or apparatus or device) or a propagation medium. The medium may include a computer-readable medium such as a semiconductor or solid state memory, magnetic tape, a removable computer diskette, a random access memory (RAM), a read-only memory (ROM), a rigid magnetic disk and an optical disk, etc.

The present embodiments may be provided and used in any transmitter/receiver application. The present system and method may be employed in electrical signaling systems, optical signaling systems or any other signaling system or network.

Figure 1:
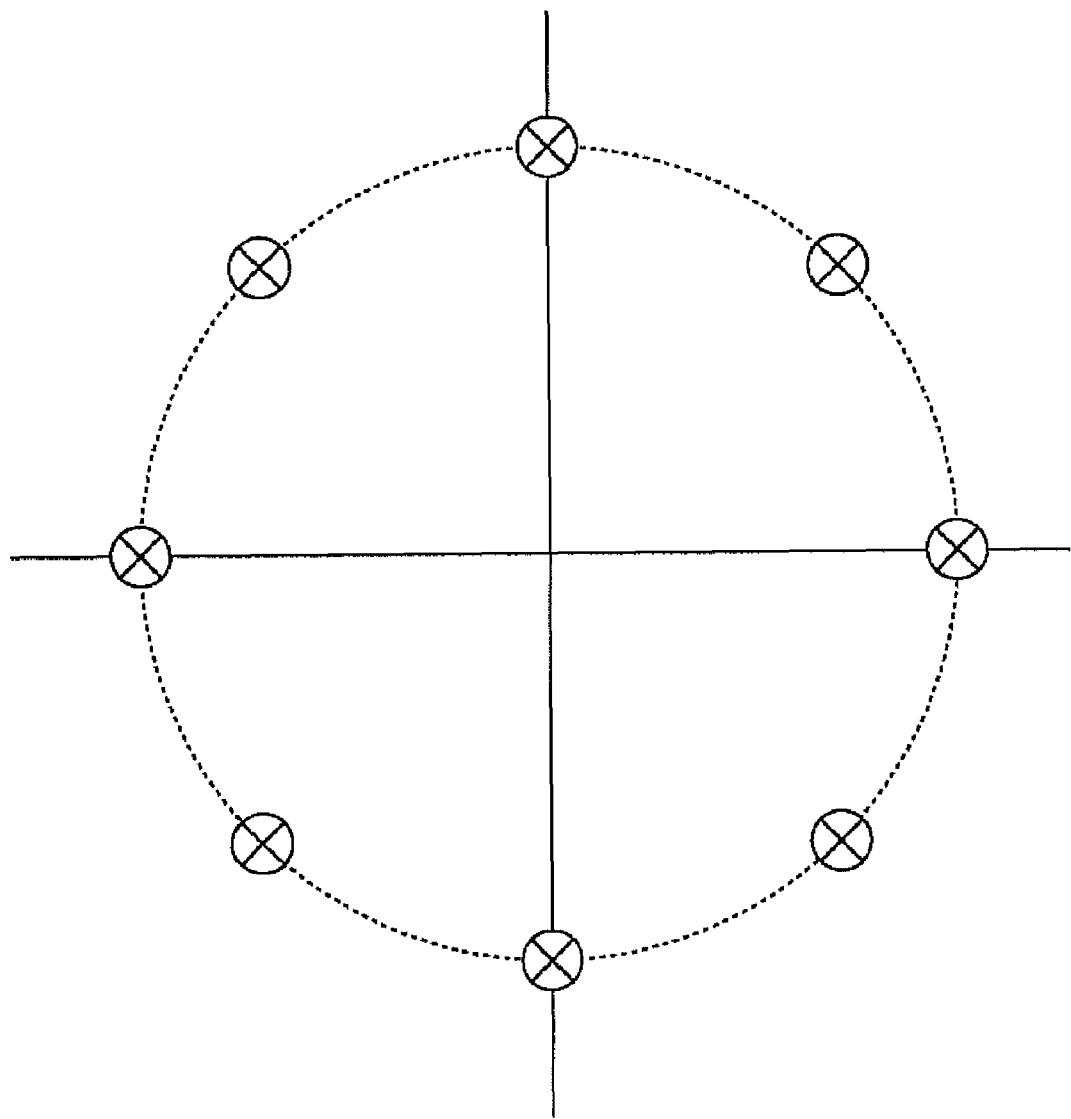
FIG. 1 is a constellation diagram showing 8 phase shift keying in accordance with the prior art.
Figure 2:
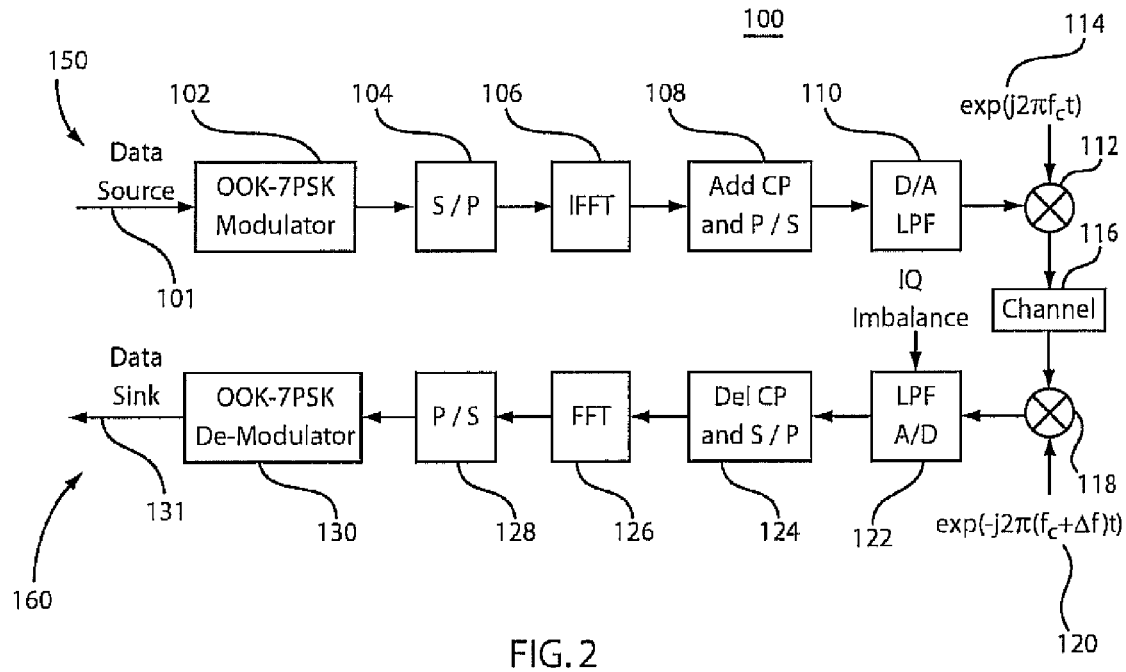
FIG. 2 is a block/flow diagram showing a transceiver with corresponding transmitter and receiver portions employing on-off keying-7 phase shift keying (OOK-7-PSK) in accordance with one illustrative embodiment.
Figure 3:
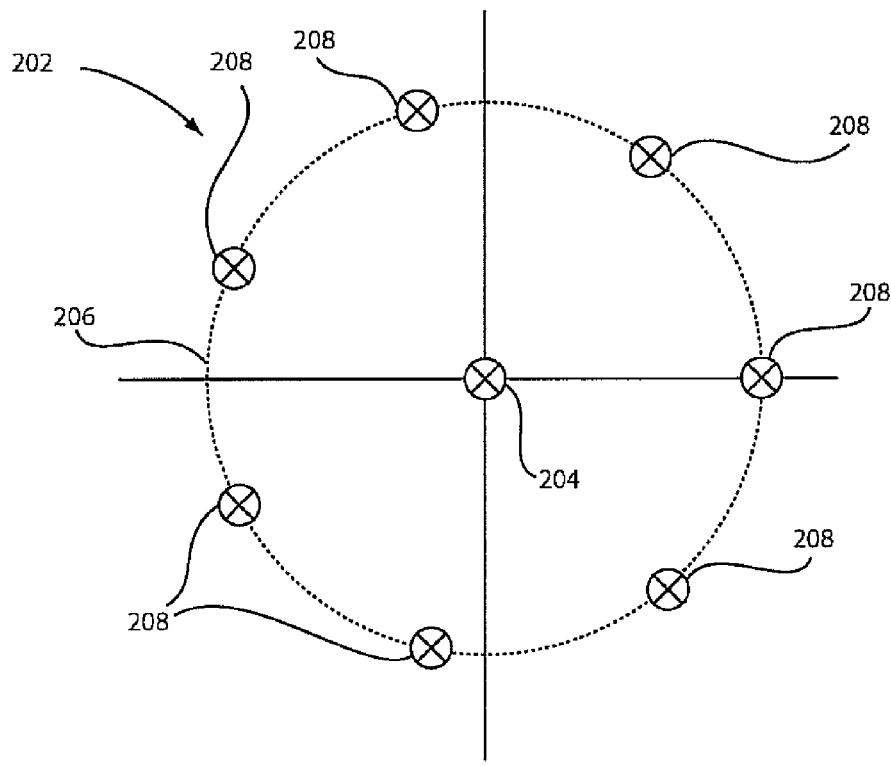
FIG. 3 is a constellation diagram showing OOK-7-PSK in accordance with the present principles.

Referring now to the drawings in which like numerals represent the same or similar elements and initially to FIG. 2, a block/flow diagram of an OFDM system 100 is depicted in accordance with the present principles. System 100 shows both a transmitter 150 and a receiver 160. These components may be employed together or separately as needed. An OOK-7PSK modulator 102 is employed in this system, whose constellation is shown in FIG. 3. The effects of CFO and IQ imbalance have been considered and will be discussed hereinafter.

An input data stream 101 from a data source is first modulated by OOK-7PSK modulator 102, resulting in a serial complex symbol stream. This symbol stream 101 is passed through a serial-to-parallel converter (S/P) 104, whose output is a set of N parallel symbols. Then, these N parallel symbols in frequency domain are converted into samples in time domain by taking an inverse Fast Fourier Transform (IFFT) 106. The IFFT 106 yields the OFDM symbols including the sequence of length N, which corresponds to samples of the multi-carrier signal that includes linearly modulated sub-carriers. Then, in block 108, a cyclic prefix (CP) is added to the OFDM symbol to avoid Inter-Symbol Interference (ISI), and the resulting time symbols are converted from parallel to serial (P/S) (block 108). The time symbols are passed through a digital to analog (D/A) converter and a low-pass filter (LPF) 110.

A final resulting OFDM signal is then upconverted using mixer 112 to a carrier frequency $f_c$ 114 and provided on a channel 116.

A receiver portion 160 performs the opposite functions of the transmitter 150. An OFDM signal is downconverted using mixer 118 to the carrier frequency $f_c$ 120 from channel 116. The transmitted signal from channel 116 may be filtered by a channel impulse response and corrupted by Additive White Gaussian Noise (AWGN) in simulations. The transmitted OFDM signal is impaired by the CFO (Δf') and IQ imbalance. The time symbols are passed through a low-pass filter (LPF) and an analog to digital (A/D) converter 122. In block 124, the cyclic prefix (CP) is deleted from the OFDM symbol, and the resulting time symbols are converted from serial to parallel (S/P) (block 124). Then, these N parallel symbols in time domain are converted into samples in frequency domain by taking a Fast Fourier Transform (FFT) 126. The symbol stream is passed through a parallel-to-serial converter (P/S) 128, which takes a set of N parallel symbols and serially inputs them to a demodulator 130. Demodulators 130 demodulates by OOK-7PSK, resulting in a serial complex symbol stream output to a data sink 131.

Referring to FIG. 3, OOK-7PSK in accordance with the present invention includes a 7-PSK constellation 202 plus a point 204 at the origin. When data information is mapped to the point 204 at the origin, the corresponding sub-carrier is not used for transmission, i.e., there is no power to be transmitted on that sub-carrier, which will not contribute to ICI. Hence, the resulting number of sub-carriers for the present system using OOK-7PSK becomes variable, which means different numbers of sub-carriers are transmitted over different symbol intervals, resulting in a variable sub-carrier OFDM system. Since not all sub-carriers are transmitted simultaneously all the time, power efficiency can be increased and the average ICI in the OFDM system can be decreased, which results in performance improvements.

The OFDM system using OOK-7PSK modulation, whose signal constellation includes seven evenly spaced points 208 on a circle 206 plus the point 204 at the origin, provides signal waveforms that can be expressed as:

$$s_m(t) = \begin{cases} g(t)\cos\left[2\pi f_c t + \frac{2\pi}{7}(m-1)\right] & (1 \le m \le 7) \\ 0 & (m = 8) \end{cases} \quad (2)$$

$$0 \le t \le T$$

where g(t) is the pulse shape of the transmitted signal and T is the duration of the symbol.

When data is mapped to the point at the origin, the corresponding sub-carrier is not used for transmission, i.e., there is no power to be transmitted on that sub-carrier, which will not contribute to the ICI when the CFO and the IQ imbalance exist. Hence, the resulting numbers of sub-carriers using OOK-7PSK modulation becomes variable, so that the average separation between sub-carriers is increased, resulting in the probability of symbol error being improved. The points 208 are asymmetrically disposed about the axes passing through the origin.

Not all sub-carriers being transmitted at the same time has ⅛ probability of not being transmitted. Hence, the average CIR for the present OFDM system using OOK-7PSK modulation can be expressed as $$CIR_{OOK-7PSK} = \frac{|X(k)S(0)|^2}{E\left[\left|\sum_{l=0,l \ne k}^{N-1} X(l)S(l-k)\right|^2\right]} \quad (3)$$

$$= \frac{|S(0)|^2}{(7/8)\sum_{l=1}^{N-1}|S(l)|^2}$$

$$= (8/7)CIR_{8\text{-}PSK}$$

Figure 4:
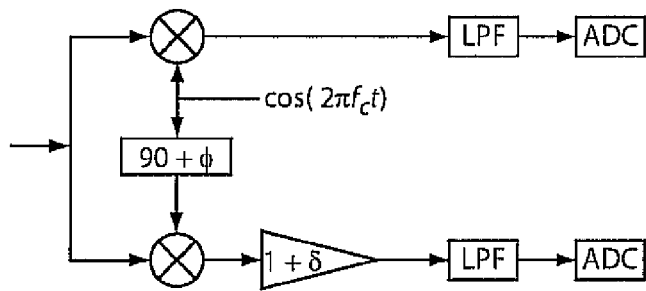
FIG. 4 is a block diagram demonstrating phase and amplitude imbalances to be accounted for at a receiver.

IQ Imbalance: The effect caused by IQ imbalance is now considered. Referring to FIG. 4, IQ imbalance at the receiver is illustratively shown. In a conventional OFDM system, IQ imbalance can be characterized by two parameters: the amplitude imbalance between I and Q channel, and the phase imbalance. The complex baseband signal x(t) is up-converted to the desired carrier frequency ($f_c$), and then amplified before transmission. At the receiver, a down-converted and low-pass filtered (LPF) RF signal is sampled to yield the sequence for FFT demodulation. The IQ imbalance at the receiver distorts this received signal. The received signal on the $k^{th}$ sub-carrier after the FFT can be expressed as:

$$Y(k) = \alpha X(k) + \beta X^*(N-1-k) + N(k) \quad (4)$$

where $k = 0, 1, \ldots N-1$ $\alpha = 0.5\{1 + (1+\delta)(\cos \phi - j \sin \phi)\}$ where δ is the amplitude imbalance $\beta = 0.5\{1 - (1+\delta)(\cos \phi + j \sin \phi)\}$ and φ is the phase imbalance at the receiver.

Equation (4) shows that the gain and phase mismatches in the receiver cause the symbol at the sub-carrier k to be multiplied by the complex factor α. In addition, a spurious component will be present which is equal to the conjugate of the symbol at the $(N-1-k)^{th}$ sub-carrier multiplied by another complex factor β. The symbol at the $k^{th}$ sub-carrier will include an interference related to the symbol at the $(N-1-k)^{th}$ sub-carrier, and vice versa.

As mentioned, in OFDM systems using conventional 8-PSK modulation, all sub-carriers are used to transmit information, hence, the IQ imbalance will result in each sub-carrier being interfered with by its frequency mirror-image sub-carrier. All of them will contribute to ICI. However, in the OFDM system using OOK-7PSK modulation, the sub-carriers may not be transmitted at the same time, thus the average ICI caused by using OOK-7PSK modulation is just ⅞ of the ICI caused by using 8-PSK modulation when IQ imbalance exists.

Joint Impairment: We have considered the effects of CFO and IQ-imbalance separately. Normally, the received signal may be affected by their joint impairments. We need to consider the joint effects of CFO and IQ imbalance. The received signal on the $k^{th}$ sub-carrier after the FFT processing can be expressed as $$\hat{Y}(k) = \alpha X(k)S(0) + \sum_{l=0,l\neq k}^{N-1} \alpha X(l)S(l-k) + \sum_{i=0}^{N-1} \beta X^*(l)S^*(l-(N-1-k)) + \alpha N(k) + \beta N^*(N-1-k)) \quad (5)$$

while this joint IQ imbalance and CFO causes more ICI, the average CIR for an OFDM system can be expressed as The average CIR for the proposed OFDM system using OOK-7PSK can be expressed as $$CIR_{OOK-7PSK} = \frac{|\alpha S(0)|^2}{(7/8)\left\{|\alpha|^2 \sum_{l=1}^{N-1} |S(l)|^2 + |\beta|^2 \sum_{l=0}^{N-1} |S^*(l-N+1)|^2\right\}} \quad (6)$$

$$= (8/7)CIR_{8-PSK}$$

Figure 5:
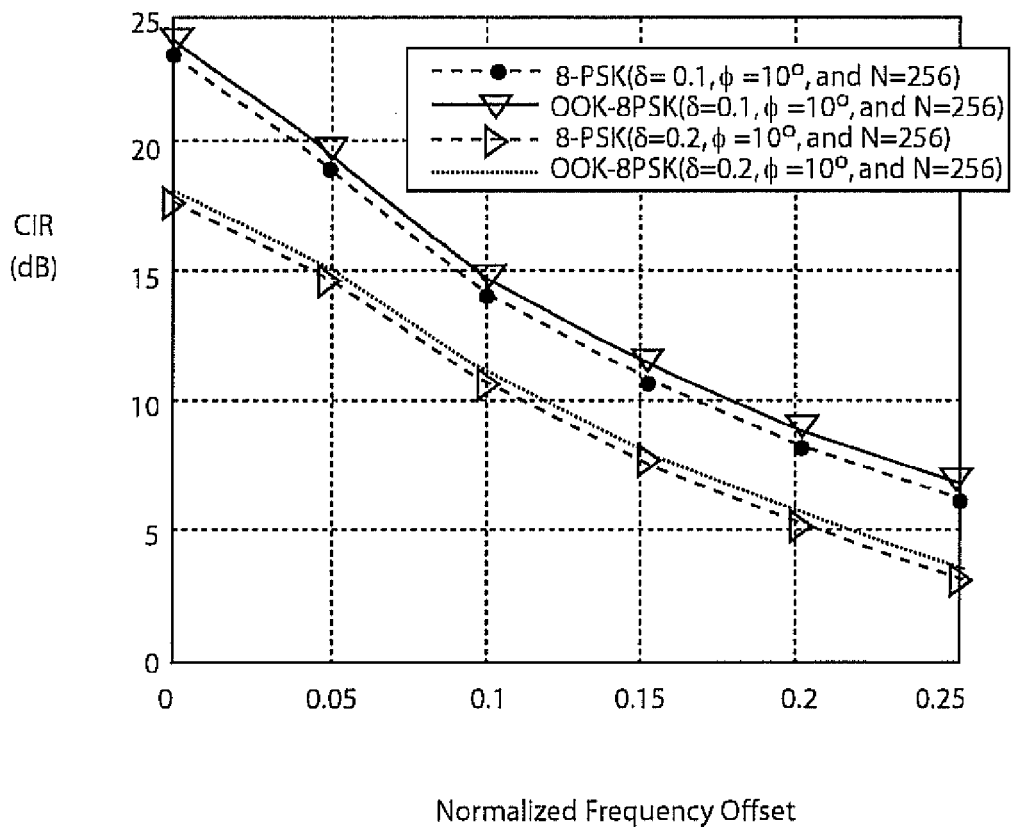
FIG. 5 is a plot of CIR versus normalized frequency offset for different IQ imbalances.

Referring to FIG. 5, average CIRs between an OFDM system using 8-PSK and the OFDM system using OOK-7PSK for a normalized frequency offset ε varying from 0.01 to 0.25 with different IQ imbalances is shown. The number of sub-carriers is 256. FIG. 5 shows CIRs versus normalized frequency offset with different IQ imbalances. Note that, as the CFO increases, the CIR decreases. The CIRs of OOK-7PSK perform at least 0.58 dB better than the ones of 8-PSK. Also, when the IQ imbalance increases, the CIRs for both OFDM systems decrease over all CFOs.

Figure 6:
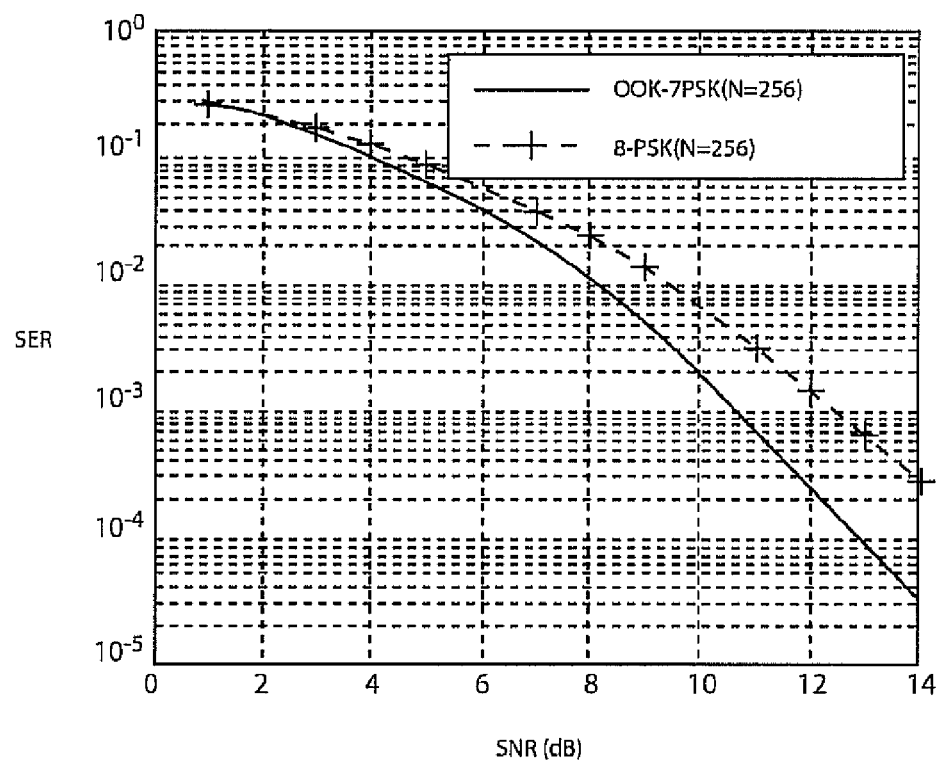
FIG. 6 is a plot symbol error rate (SER) versus signal to noise ratio (SNR) under the conditions of $\epsilon=0.01$, $\delta=0.1$, and $\phi=10°$.
Figure 7:
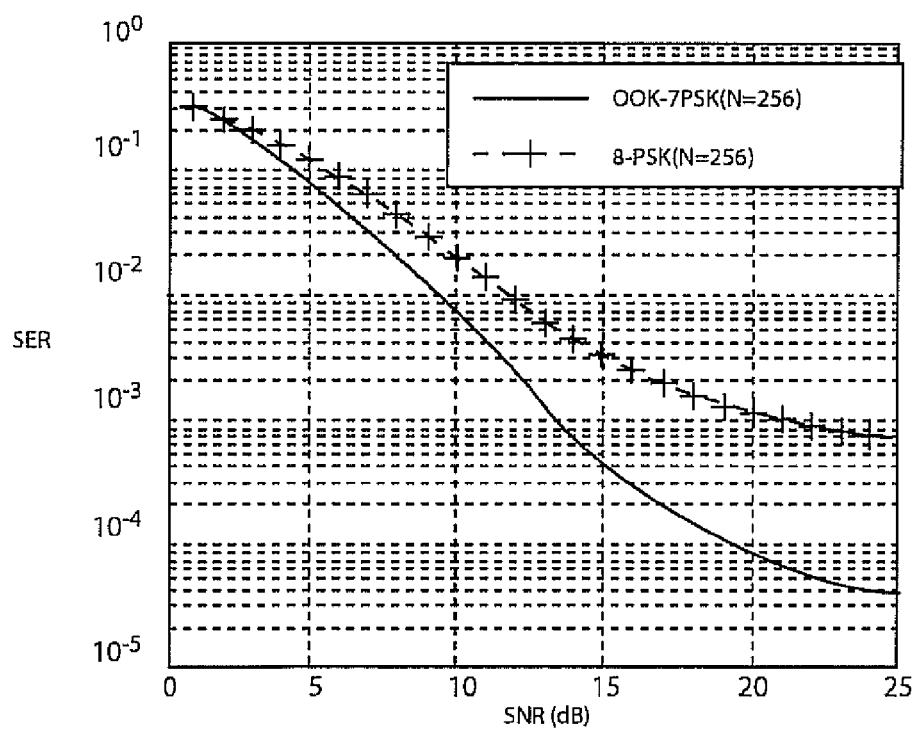
FIG. 7 is a plot symbol error rate (SER) versus signal to noise ratio (SNR) changing the conditions to $\epsilon=0.05$, $\delta=0.2$, and $\phi=10°$.

Referring to FIGS. 6-7 and tables 1-2, symbol error rate (SER) performances for an OFDM system using conventional 8-PSK and the OFDM system using OOK-7PSK with different IQ imbalances at different CFOs are shown. As CFO and IQ imbalance changes, the signal to noise (SNR) gains between the present OFDM system and a conventional OFDM system are also changed. In FIG. 6, the SNR gain is 1.8 dB in favor of the OOK-7PSK at a SER of $10^{-3}$ under the conditions of ε=0.01, δ=0.1, and φ=10°. FIG. 7 shows SER versus SNR for the following conditions: ε=0.05, δ=0.2, and φ=10°.

Table 1 shows the gains between the OOK-7PSK and conventional 8-PSK with the fixed IQ imbalance of δ=0.05, φ=5° at different CFOs. When the CFO is increased from 0.01 to 0.10, the gain between the OOK-7PSK and conventional 8-PSK is increased from 1.85 dB to 4.62 dB.

TABLE 1

| | | δ = 0.05, φ = 5° | | |
|---|---|---|---|---|
| ε | SER | OOK-7PSK $(E_b/N_0)$(dB) | 8-PSK $(E_b/N_0)$(dB) | GAIN (dB) |
| 0.01 | $10^{-3}$ | 10.00 | 11.15 | 1.15 |
| 0.05 | $10^{-3}$ | 11.15 | 12.95 | 1.80 |
| 0.10 | $10^{-2}$ | 11.53 | 16.15 | 4.62 |

Table 2 shows the gains between the OOK-7PSK and conventional 8-PSK with the fixed CFO of ε=0.10 at different IQ imbalances. We note that, when the IQ imbalance is changed from δ=0.05, φ=5° to δ=0.20, φ=10°, the gain between the OOK-7PSK and conventional 8-PSK is changed from 1.85 dB to 6.70 dB at a SER of $10^{-3}$.

TABLE 2

| | | ε = 0.10 | | |
|---|---|---|---|---|
| δ/φ | SER | OOK-7PSK $(E_b/N_0)$(dB) | 8-PSK $(E_b/N_0)$(dB) | GAIN (dB) |
| 0.05/5 | $10^{-3}$ | 11.10 | 12.95 | 1.85 |
| 0.10/10 | $10^{-3}$ | 12.25 | 15.45 | 3.20 |
| 0.20/10 | $10^{-3}$ | 13.30 | 20.00 | 6.70 |

A comparison between FIGS. 6-7 and Tables 1-2 shows that the OFDM system using OOK-7PSK modulation is rather robust to CFO and IQ imbalances compared with an OFDM system using conventional 8-PSK modulation. Therefore, the present OFDM system can be used in the case where CFO and IQ imbalance exist.

An OFDM system using OOK-7PSK modulation has been disclosed and the SER performances under the effects of both CFO and IQ imbalance have been analyzed. By using OOK-7PSK modulation, the present OFDM system obtains SNR gains and improves power efficiency by at least 12.5%. All simulation results have shown that the present OFDM system using OOK-7PSK modulation performs better than an OFDM system using conventional 8-PSK modulation especially under the effects of both CFO and IQ imbalance.

Having described preferred embodiments for an on-off keying-7-phase shift keying modulation system and method for fiber communication (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A modulation system, comprising:
 a modulator configured to employ a modulation mechanism on data, the mechanism including:
  a signal constellation configured to map sub-carriers which comprise a signal to be modulated, the signal constellation including a plurality of points asymmetrically disposed on a circle about an origin and a point at the origin wherein a number of sub-carriers becomes variable over different symbol intervals.

2. The system as recited in claim 1, wherein the constellation includes 7 evenly spaced points on the circle.

3. The system as recited in claim 1, wherein the 7 evenly spaced points on the circle are asymmetrical relative to axes defined by the origin.

4. The system as recited in claim 1, wherein the mechanism includes on-off keying-7 phase shift keying (OOK-7PSK).

5. The system as recited in claim 1, wherein data is mapped to the origin, no corresponding sub-carrier is used for transmission.

6. The system as recited in claim 5, wherein when data is mapped to the origin, no power is transmitted and no contribution to Inter-Carrier Interference (ICI).

7. The system as recited in claim 5, wherein power efficiency is increased by at least 12.5% over 8-PSK.

8. The system as recited in claim 1, wherein when mapping to the origin, no corresponding sub-carrier is used for transmission.

9. A modulation system, comprising:
a demodulator configured to employ a demodulation mechanism on data which accounts for at least IQ imbalance and carrier frequency offset (CFO) in a received signal, the mechanism including:
a signal constellation configured to map sub-carriers which comprise a signal to be demodulated, the signal constellation including a plurality of points asymmetrically disposed on a circle about an origin and a point at the origin wherein a number of sub-carriers becomes variable over different symbol intervals.

10. The system as recited in claim 9, wherein the constellation includes 7 evenly spaced points on the circle.

11. The system as recited in claim 9, wherein the 7 evenly spaced points on the circle are asymmetrical relative to axes defined by the origin.

12. The system as recited in claim 9, wherein the mechanism includes on-off keying-7 phase shift keying (OOK-7PSK).

13. The system as recited in claim 9, wherein when no corresponding sub-carrier is present data is mapped to the origin.

14. The system as recited in claim 9, wherein when no power is transmitted, data is mapped to the origin.

15. A modulation method, comprising:
modulating a signal using an on-off keying-7 phase shift keying (OOK-7-PSK) modulation mechanism which includes a signal constellation; and
mapping sub-carriers which comprise a signal to be modulated to the signal constellation, which includes a plurality of points asymmetrically disposed on a circle about an origin and a point at the origin wherein a number of sub-carriers becomes variable over different symbol intervals.

16. The method as recited in claim 15, wherein the constellation includes 7 evenly spaced points on the circle.

17. The method as recited in claim 15, wherein the 7 evenly spaced points on the circle are asymmetrical relative to axes defined by the origin.

18. A modulation method, comprising:
demodulating a signal using an on-off keying-7 phase shift keying (OOK-7-PSK) demodulation mechanism which accounts for at least IQ imbalance and carrier frequency offset (CFO) in a received signal, and includes a signal constellation; and
mapping sub-carriers which comprise a signal to be demodulated to the signal constellation which includes a plurality of points asymmetrically disposed on a circle about an origin and a point at the origin wherein a number of sub-carriers becomes variable over different symbol intervals.

19. The method as recited in claim 18, wherein the constellation includes 7 evenly spaced points on the circle.

20. The method as recited in claim 18, wherein the 7 evenly spaced points on the circle are asymmetrical relative to axes defined by the origin.

21. The method as recited in claim 18, wherein when no corresponding sub-carrier is present data is mapped to the origin.

* * * * *